(12) United States Patent
Pornin et al.

(10) Patent No.: US 9,896,331 B2
(45) Date of Patent: Feb. 20, 2018

(54) METHOD FOR ENCAPSULATING A MICROELECTRONIC DEVICE WITH A RELEASE HOLE OF VARIABLE DIMENSION

(71) Applicant: Commissariat a L'Energie Atomique et aux Energies Alternatives, Paris (FR)

(72) Inventors: Jean-Louis Pornin, Crolles (FR); Xavier Baillin, Crolles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/357,316

(22) Filed: Nov. 21, 2016

(65) Prior Publication Data

US 2017/0152137 A1   Jun. 1, 2017

(30) Foreign Application Priority Data

Nov. 27, 2015  (FR) ...................... 15 61474

(51) Int. Cl.
  *B81C 1/00*  (2006.01)
(52) U.S. Cl.
  CPC .... *B81C 1/00333* (2013.01); *B81C 2201/013* (2013.01); *B81C 2201/017* (2013.01);
  (Continued)
(58) Field of Classification Search
  CPC .... H05K 7/14; B81B 7/0038; B81C 1/00293; B81C 1/00261; B81C 1/00277; B81C 2203/0145
  (Continued)

(56) References Cited

U.S. PATENT DOCUMENTS 7,648,859 B2  1/2010  Robert
8,183,474 B2 *  5/2012  Gillot ..................... B81B 3/007
            174/544
(Continued)

FOREIGN PATENT DOCUMENTS

FR  2 864 340 A1  6/2005
FR  2 948 928 A1  2/2011

OTHER PUBLICATIONS

Jocelyne Jouanneau, "Pyrometres a bilames" (with English translation), Techniques De L'Ingenieur, 1985, 18 pgs.

*Primary Examiner* — Marcos D Pizarro
*Assistant Examiner* — Antonio Crite
(74) *Attorney, Agent, or Firm* — Oblon, McClelland, Maier & Neustadt, L.L.P.

(57) ABSTRACT

Method for encapsulating a microelectronic device, comprising the following steps:
  producing a sacrificial portion covering the device;
  producing a cover covering the sacrificial portion, comprising two superimposed layers of separate materials and having different residual stresses and/or coefficients of thermal expansion;
  etching, through the cover, of a trench of which the pattern comprises a curve and/or two straight non-parallel segments;
  etching of the sacrificial portion through the trench;
  depositing a sealing material on the trench;
  in which, during the etching of the sacrificial portion, a portion of the cover defined by the trench deforms under the effect of a mechanical stress generated by the residual stresses and/or a thermal expansion of the layers of the cover and increases the dimensions of the trench, this stress being eliminated before the sealing of the trench.

16 Claims, 3 Drawing Sheets

(52) U.S. Cl.
CPC .............................. *B81C 2201/056* (2013.01); *B81C 2203/0136* (2013.01); *B81C 2203/0154* (2013.01)

(58) Field of Classification Search
USPC ................................................ 174/520, 50.5
See application file for complete search history.

(56) References Cited

U.S. PATENT DOCUMENTS

| | | |
|---|---|---|
| 8,367,929 B2 | 2/2013 | Baillin et al. |
| 2008/0041607 A1* | 2/2008 | Robert ................ B81C 1/00293 174/50.5 |
| 2008/0079142 A1 | 4/2008 | Carmona et al. |
| 2010/0003789 A1* | 1/2010 | Caplet ................. B81C 1/00285 438/124 |
| 2011/0030989 A1* | 2/2011 | Baillin ................ B81C 1/00293 174/50 |
| 2011/0189844 A1* | 8/2011 | Pornin .................. B81B 7/0058 438/584 |
| 2013/0207281 A1* | 8/2013 | Baillin .................. B81B 7/0038 257/787 |
| 2014/0147955 A1 | 5/2014 | Lee et al. |
| 2015/0266718 A1 | 9/2015 | Maling et al. |

* cited by examiner

# METHOD FOR ENCAPSULATING A MICROELECTRONIC DEVICE WITH A RELEASE HOLE OF VARIABLE DIMENSION

TECHNICAL FIELD AND PRIOR ART

The invention pertains to the field of microelectronics, and more particularly to that of the encapsulation of microelectronic devices for example of MEMS (Micro-Electro-Mechanical System) and/or NEMS (Nano-Electro-Mechanical System) and/or MOEMS (Micro-Opto-Electro-Mechanical System) and/or NOEMS (Nano-Opto-Electro-Mechanical System) type.

One embodiment of the invention notably relates to an encapsulation method of Thin Film Packaging (TFP) type.

The integration of microelectronic devices for example of MEMS or NEMS type in the industrial sector or in tools of everyday life is more and more frequent, with a stronger and stronger demand for miniaturisation and cost reduction. This integration passes by a step of packaging which serves to protect the microelectronic device and to assure its functionality throughout its lifetime, while taking account of the stresses to which the device is subjected: vibrations, temperature changes, sensitivity to certain gases, etc.

Such a packaging may be produced by thin film encapsulation, also named Thin Film Packaging or TFP. This method consists in producing above the microelectronic device a protective capsule arranged as near as possible to the active part of the device, using microelectronic techniques. Such an encapsulation is advantageously implemented in a collective manner for several microelectronic devices produced on a same substrate: this is then referred to as packaging at the scale of the substrate, or WLP for "Wafer Level Packaging".

The TFP method consists firstly in depositing and localizing a sacrificial material above the microelectronic device to protect. An encapsulation layer, generally of mineral type, is then deposited on this sacrificial material. Release holes are then made through the encapsulation layer to enable the elimination of the sacrificial material, mainly by dry etching. This elimination of the sacrificial material is also named microelectronic device release step, and makes the cavity in which is arranged the microelectronic device. The method is then finished by sealing the release holes so as to close the cavity, advantageously in a hermetic manner. This sealing is obtained by depositing sealing layers either by evaporation (PVD, PECVD type method, etc.) of one or more metal or mineral layers, or by spin coating of polymer.

The difficulty of implementing this step of sealing the release holes consists in not depositing sealing material inside the cavity, which if not could adversely affect the correct operation of the microelectronic device. The diameter and the number of release holes are thus defined so as to find a compromise between a short release time, obtained by making release holes with the largest possible diameter and the facility of sealing, obtained by making release holes with the smallest possible diameter.

In order to be free of this compromise, several solutions have been proposed.

The document FR 2 948 928 A1 describes an encapsulation structure of a microelectronic device of which the cover is provided with a valve arranged facing a release hole which traverses the cover. The valve may seal or not the hole according to the temperature to which the valve is subjected, due to the fact that this valve comprises two portions of materials of different coefficients of thermal expansion. This valve is in open position during the microelectronic device release step, then is brought into closed position under the release hole during the sealing step. The release hole may thus be made with a large diameter since during the deposition of the sealing material, this will be deposited inside the hole while pressing against the valve which closes access to the inside of the cavity.

The document FR 2 864 340 A1 also describes an encapsulation structure comprising a valve formed on the cover.

The document US 2015/0266718 A1 describes a method in which release holes of different dimensions are made through the cover. Holes of small dimensions are made above the active part of the microelectronic device and a hole of large dimension is made above a non-sensitive part of the microelectronic device. The holes of small dimensions are sealed by implementing a first deposition not generating troublesome deposition of sealing material on the microelectronic device.

This first deposition nevertheless does not make it possible to seal the hole of large dimensions. The sealing of the hole of large dimensions is then carried out using a method of deposition at higher pressure, which induces an important deposition of sealing material on the microelectronic device. Nevertheless, due to the fact that the hole of large dimensions is located above a non-sensitive part of the microelectronic device, this deposition of the sealing material in the cavity is not penalising for the operation of the microelectronic device. This method makes it possible to obtain cavities closed under a higher pressure than with the method described previously calling upon the sealing valve.

The document US 2008/0079142 A1 describes the production of a cover formed of two layers spaced apart and each pierced with release holes. The release holes formed through each of the layers are not superimposed, thereby forming a network of chicanes between the outside and the inside of the cavity. The layer of the cover the closest to the microelectronic device thus serves as protective layer with respect to sealing material.

The main drawback common to all the methods described above is that they necessitate the implementation of additional steps, notably of photolithography and etching, compared to a conventional encapsulation method. Yet, these additional steps have an important impact on the final cost of the encapsulated device.

Another drawback linked to the sealing of holes of large dimensions is that, apart from adding further additional deposition steps aiming to reduce the size of these holes prior to sealing, the deposition of the sealing material, for example of SACVD or PECVD type, is carried out at a relatively high pressure (several hundreds of mT) and in the presence of chemical precursors. Yet, this is incompatible with an encapsulation of the microelectronic device at low pressure and/or under an inert atmosphere.

DESCRIPTION OF THE INVENTION

Thus there is a need to propose a method for encapsulating a microelectronic device that is free of the compromise relative to the dimensions of the release holes, which does not necessitate the implementation of additional steps during the encapsulation compared to a conventional encapsulation method, and which is compatible with an encapsulation at low pressure and/or under inert atmosphere.

To do so, one embodiment proposes a method for encapsulating at least one microelectronic device, comprising at least:

producing at least one portion of sacrificial material covering at least the microelectronic device;

producing at least one cover covering at least the portion of sacrificial material, the cover comprising at least two superimposed layers of separate materials and having different residual stresses and/or different coefficients of thermal expansion;

etching, through the cover, of at least one trench of which the pattern, at an upper face of the cover, comprises at least one curve and/or at least two straight segments non-parallel with respect to each other and joining at an intersection point;

etching the portion of sacrificial material through the trench such that, during this etching, a portion of the cover defined by the trench deforms under the effect of a mechanical stress generated by the residual stresses and/or a thermal expansion of said at least two layers of the cover and increases the dimensions of the trench;

at least partial elimination of the mechanical stress;

depositing at least one sealing material at least on the trench.

This method shrewdly uses the mechanical and/or thermomechanical properties of the materials used to form the cover to be free of the compromise relative to the dimensions of the release holes which has to be made in methods of the prior art. In fact, the particular trench produced defines a portion of the cover forming a tongue capable of deforming during the etching of the portion of sacrificial material under the effect of residual stresses and/or the thermal expansion of the materials of the cover. Thus, during the etching of the portion of sacrificial material, the trench forms a release hole of large dimension, making it possible to carry out quickly the etching of the sacrificial material and thus the release of the microelectronic device. At the end of this etching, the tongue recovers its initial position, or a position close to its initial position, due to the fact of the at least partial elimination of the mechanical stress behind the deformation of this tongue. The trench then also recovers dimensions less than those when the tongue is deformed, which makes it possible then to carry out the sealing of the trench without risk of deposition of sealing material in the encapsulation cavity.

Moreover, due to the fact that the cover is directly made from materials having different residual stresses and/or different coefficients of thermal expansion, no particular shaping is necessary to define the portion of the cover which deforms during the etching of the sacrificial material. The trench may be etched in a single photolithography and etching step, even if the cover comprises several layers. In terms of number of implementation steps, given that the etching of the trench corresponds to the step of making the release hole, this method may comprise a number of steps (notably of photolithography and etching) similar to conventional encapsulation methods.

Finally, due to the fact that the mechanical stress deforming the portion of the cover is at least partially eliminated before the deposition of the sealing material, which means that the trench recovers its initial dimensions or dimensions close to its initial dimensions, or at least dimensions less than those when the tongue is deformed, the deposition of the sealing material may be carried out without having to resort to high pressures and/or particular chemical precursors. This method is thus compatible with an encapsulation at low pressure, for example between around 10 Pa and $10^5$ Pa and/or under an inert atmosphere, for example via PVD.

Before the deposition of the sealing material, the mechanical stress is at least partially eliminated. During the deposition of the sealing material, a residual stress may be tolerated if it generates a deformation not preventing sealing.

When the portion of the cover is not deformed, a width of the trench, corresponding to the smallest dimension of the trench at the upper face of the cover, may be of the order of a micron, or between around 1 µm and 2 µm. Moreover, the deformation of the portion of the cover may be such that this width of the trench is between around 4 µm and 10 µm when the portion of the cover is deformed.

During the etching of the portion of sacrificial material, the deformation of the portion of the cover may be such that a free end of the portion of the cover moves outside of the cavity, that is to say towards the outside of the cavity. In a variant, this deformation may be such that the free end of the portion of the cover moves towards the inside of the cavity.

A first of the two layers of the cover arranged between the portion of sacrificial material and a second of the two layers of the cover may comprise a residual stress of value and/or type (compressive or tensile) different to the residual stress of the second of the two layers of the cover.

Advantageously, the first of the two layers of the cover may comprise a residual compressive stress and the second of the two layers of the cover may comprise a residual tensile stress.

Thus, when the portion of the cover is released of sacrificial material, the portion of the cover may be subjected to an overall residual stress which may advantageously deform the portion of the cover such that the free end of the portion moves outside of the cavity.

According to a variant, the two layers of the cover may each comprise a residual compressive stress. In this case, in order that the free end of the portion of the cover moves outside of the cavity during the etching of the portion of sacrificial material, the residual compressive stress of the second layer may be less than that of the first layer.

According to another variant, the two layers of the cover may each comprise a residual tensile stress. In this case, in order that the free end of the portion of the cover moves outside of the cavity during the etching of the portion of sacrificial material, the residual tensile stress of the second layer may be greater than that of the first layer.

According to another variant, the first of the two layers of the cover may comprise a residual tensile stress and the second of the two layers of the cover may comprise a residual compressive stress. In this case, during the etching of the portion of sacrificial material, the free end of the portion of the cover moves towards the inside of the cavity.

The first of the two layers of the cover may comprise $SiO_2$ and the second of the two layers of the cover may comprise nickel. This configuration can make it possible to obtain residual compressive and tensile stresses respectively in the first layer and in the second layer.

The second of the two layers of the cover may comprise a stack of a sub-layer including titanium covering the first of the two layers of the cover and a layer of nickel covering the sub-layer. Such a sub-layer of titanium has the advantage of improving the adhesion of the second of the two layers of the cover on the first of the two layers of the cover.

The at least partial elimination of the mechanical stress deforming the portion of the cover may comprise the implementation of a removal of at least one part of the second of the two layers of the cover. This removal step enables the portion of the cover to recover a substantially non-deformed position when the deformation of the portion of the cover is generated by the residual stresses of the second of the two layers of the cover. When the second layer of the cover comprises nickel, this removal step may notably consist in removing this nickel.

A first of the two layers of the cover, arranged between the portion of sacrificial material and a second of the two layers of the cover, may comprise a coefficient of thermal expansion greater than that of the second of the two layers of the cover, and the etching of the portion of sacrificial material may be implemented at a temperature generating a deformation of the portion of the cover due to the thermal expansion of the two layers.

To obtain such a thermal expansion, the first of the two layers of the cover may comprise aluminium and the second of the two layers of the cover may comprise titanium.

The at least partial elimination of the mechanical stress deforming the portion of the cover may in this case consists in stopping subjecting the layers of the cover to the temperature generating a deformation of the portion of the cover due to the thermal expansion of the two layers.

The deposition of sealing material may be implemented at ambient temperature, which eliminates mechanical stress deforming the portion of the cover when this deformation is due to the thermal expansion of the two layers which have different coefficients of thermal expansion.

The step of etching the trench through the cover may also etch holes through the cover and be able to have at least one dimension (this dimension being for example the diameter in the case of a hole of circular section, or the dimension of one side in the case of a hole of polygonal section) substantially similar to a width of the trench. Such holes may thus contribute to further accelerating the etching of the portion of sacrificial material.

Advantageously, the holes may traverse the portion of the cover that deforms during the etching of the portion of sacrificial material. Thus, the holes contribute to ending up more quickly in the deformation of the portion of the cover.

The cover may have a thickness less than or equal to around 10 µm, or even advantageously less than or equal to around 5 µm.

When one of the layers of the cover arranged against the portion of sacrificial material (previously named first layer) comprises at least one getter material, the method may further comprise, after the deposition of sealing material, a step of thermal activation of said getter material.

BRIEF DESCRIPTION OF THE DRAWINGS

The present invention will be better understood on reading the description of examples of embodiment given for purely indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily according to a uniform scale, in order to make the figures more legible.

The different possibilities (variants and embodiments) should be understood as not being mutually exclusive and may be combined together.

DETAILED DESCRIPTION OF PARTICULAR EMBODIMENTS

FIGS. 1 to 12 show the steps of a method of encapsulation of a microelectronic device 100 according to a first embodiment.

The microelectronic device 100, here of MEMS or NEMS type, is firstly produced on a substrate 102 for example comprising semiconductor such as silicon.

Figure 1:
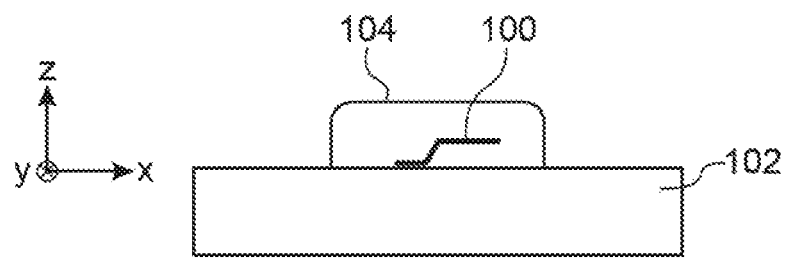
FIGS. 1 to 12 show the steps of a method of encapsulation of a microelectronic device according to a first embodiment.

A portion of sacrificial material 104 is then made on the substrate 102 such that it covers the device 100 and that its volume corresponds substantially to that of a cavity in which the device 100 is intended to be encapsulated (FIG. 1). The portion 104 is for example obtained by the implementation of depositing a layer of sacrificial material, for example a polymer, of which the thickness corresponds to the desired height of the cavity in which the device 100 is intended to be encapsulated, generally between around 1 µm and 10 µm and for example equal to around 5 µm. The layer of sacrificial material is then etched in order that only the portion 104 is kept on the substrate 102.

Figure 2:
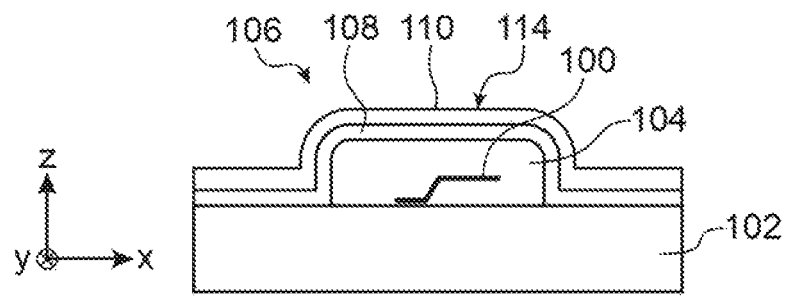

As shown in FIG. 2, a cover 106 covering the portion 104 (and also covering, in the example described here, the substrate 102 around the portion 104) is then produced. This cover 106 comprises at least two layers having different residual stresses. In the first embodiment described here, the cover 106 comprises a first layer 108 of $SiO_2$ deposited by PECVD and of which the thickness may be between around 1 µm and 2 µm. This first layer 108 has a low residual compressive stress, for example between around 20 MPa and 100 MPa. The cover 106 also comprises a second layer 110 here corresponding to a stack of several metals deposited by PVD. As an example, this stack of metals may comprise a sub-layer of titanium of thickness for example equal to around 200 nm, and a layer of nickel of thickness for example equal to around 400 nm. The sub-layer of titanium makes it possible to improve the adherence of the layer of nickel on the portion 104. The cover 106 comprises an upper face 114, formed here by the upper face of the second layer 110.

The second layer of nickel has a high residual tensile stress, for example between around 100 MPa and 1000 MPa. The residual tensile stress of the layer of nickel present in the second layer 110 of the cover 106 is added to the residual compressive stress of the first layer 108 of the cover 106. Thus, considering the overall residual stress to which the cover 106 is subjected, this is going to make it possible to obtain, in the remainder of the method, a deformation of a portion of the cover 106 towards the outside of the cavity in which will be encapsulated the device 100, that is to say in a direction going from the device 100 to this portion of the cover 106.

The residual stresses of the layers 108, 110 are obtained on account of the materials used, but may also be accentuated or reduced via the deposition parameters (temperature, speed, plasma power) used during the deposition of the layers 108, 110. Thermal treatments subsequent to these depositions may also contribute to obtaining the desired residual stresses.

Figure 3:
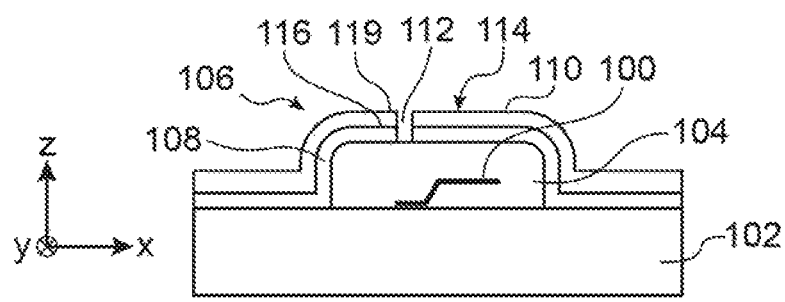
Figure 4:
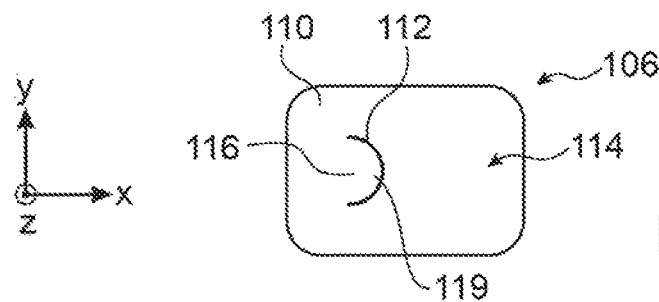

A trench 112 is then made through the entire thickness of the cover 106, at the upper face 114 of the cover 106 (FIG. 3). FIG. 4 shows a top view of the upper face 114 of the cover 106 through which the trench 112 is made according to a first example embodiment. In this first example of embodiment, the pattern of the trench 112, at the upper face 114, corresponds to a curve, for example an arc of circle. A portion 116 of the cover 106 corresponding to the concave side defined by the trench 112 thus forms a tongue capable of deforming and comprising a free end 119 capable of moving towards the outside of the encapsulation structure of the device 100. With a trench 112 of which the pattern, at the upper face 114 of the cover 106, corresponds to an arc of circle, the portion 116 has a pattern corresponding to a part of a disc. Thus, in the example of FIG. 4 where the pattern of the trench 112 corresponds substantially to a half circle, the portion 116 has a pattern corresponding substantially to a half-disc.

This portion 116 may have a length (which corresponds, in the example of FIG. 4, to the dimension passing through the upper face 114 and which is substantially perpendicular to the straight line joining the two ends of the pattern of the trench 112) between around 20 µm and 1 mm. Moreover, the trench 112 may have a width (corresponding to the smallest dimension of the trench 112, at the upper face 114) of the order of a micron.

Figure 5:
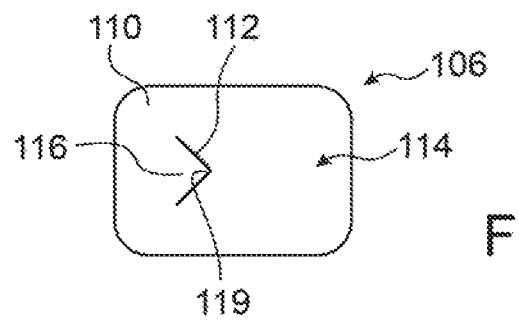

FIG. 5 shows a top view of the upper face 114 of the cover 106 traversed by the trench 112 made according to a second example embodiment.

In this second example embodiment, the pattern of the trench 112, at the upper face 114, corresponds to two segments non-parallel with respect to each other, or oriented along two different directions, and joining each other at one end of each of the two segments. With such a pattern of the trench 112, the portion 116 has a pattern, at the upper face 114 of the cover 106, of triangular shape, the free end of the portion 116 corresponding to the part located close to the junction point of the two segments forming the trench 112.

Generally speaking, the pattern of trench 112, at the upper face 114 of the cover 106, is such that it defines, in the cover 106, a portion 116 comprising at least one free end capable of moving such that the upper face of this portion 116 lies out-of-plane of the upper face 114 of the cover 106 under the effect of the residual stress exerted by the materials of the cover 106. This pattern of trench 112 may comprise at least one curve and/or at least two straight segments non-parallel with respect to each other and intersecting or joining at an intersection point.

Figure 6:
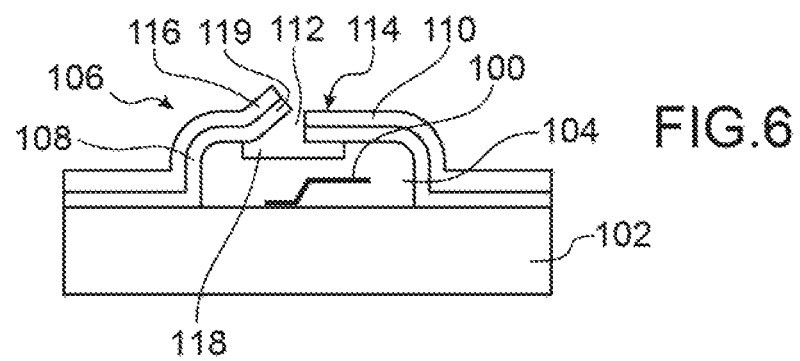

The portion 116 is then released when a part of the portion 104 located under the portion 116 is eliminated, for example by dry etching. In FIG. 6, this etching forms a space 118 located under the cover 106, around the trench 112, thereby releasing the portion 116 vis-à-vis the portion 104. Due to the fact that the portion 116 is no longer maintained, the residual stresses present in the materials of the cover 106 deform it and the free end 119 of the portion 116 moves towards the outside of the encapsulation structure of the device 100, that is to say in a direction going from the device 100 to the portion 116.

Figure 7:
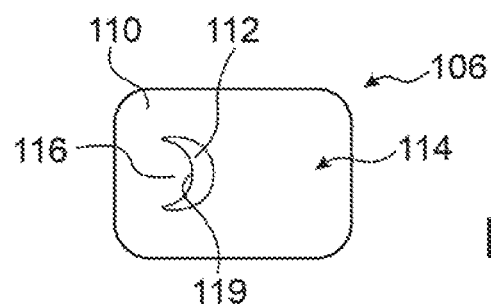
Figure 8:
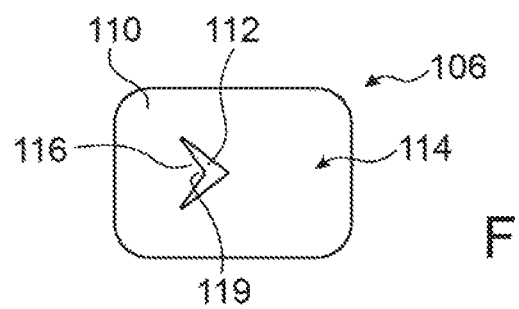

This deformation of the portion 116 increases the section of passage of etching agent through the trench 112, which makes it possible to increase exchanges between the space under the cover 106 and the outside of the encapsulation structure of the device 100, and to reduce the time necessary for etching the portion 104. FIGS. 7 and 8 show the same views as those of FIGS. 4 and 5, but after the release of the portion 116 vis-à-vis the portion 104.

Figure 9:
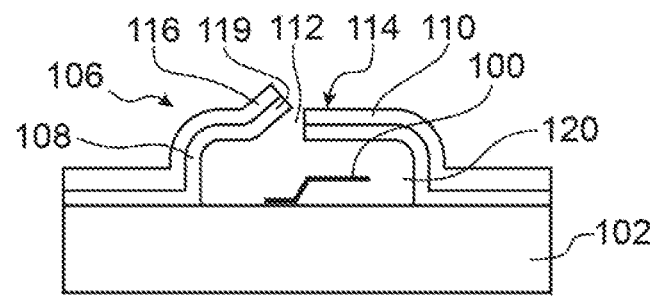

The etching forming the space 118 is extended up to the complete elimination of the portion 104, forming a cavity 120 in which the device 100 is arranged, this cavity 120 being delimited by the substrate 102 and by the cover 106 (FIG. 9).

Figure 10:
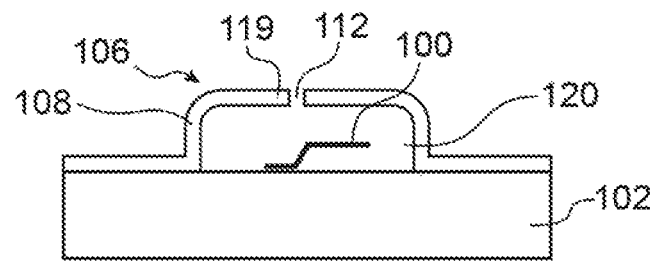

The layer(s) of the cover 106 of which the residual stresses are behind the mechanical stress deforming the portion 116, corresponding to the second layer 110 in the first embodiment described here, is then eliminated. The portion 116, which is then only formed from the layer(s) remaining at the end of this etching, here the first layer 108, then relaxes in its least stressed form while returning to its initial position (or slightly deformed according to the residual stresses in the materials of the remaining layers) corresponding substantially to that during the deposition of the first layer 108 (FIG. 10). The free end 119 of the portion 116 then lies substantially aligned with the remainder of the cover 106. The trench 112 recovers its initial shape and dimensions. The second layer 110 can be eliminated by implementing a dry etching. In the first embodiment described, the second layer 110 corresponds to a stack of a sub-layer of titanium and a layer of nickel. Given that the deformation of the portion 116 is due to the residual tensile stress introduced by the layer of nickel, it may be envisaged that only the layer of nickel is eliminated so that the portion 116 recovers its initial position. Generally speaking, the etching implemented to eliminate the material(s) behind the deformation of the portion 116 is selective vis-à-vis the materials present in the cavity 120 in order notably to avoid damaging the device 100.

Figure 11:
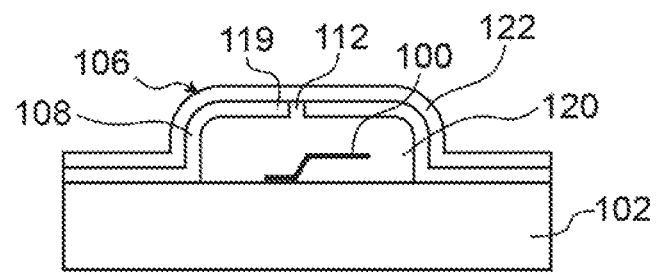
Figure 12:
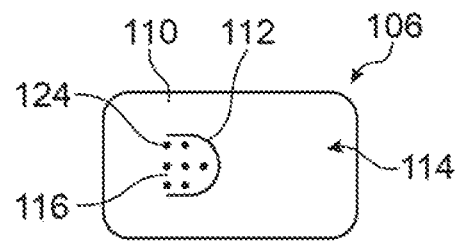

The trench 112 having recovered its initial position, the section of passage of the trench 112 between the cavity 120 and the outside of the encapsulation structure is reduced, which makes it possible to seal the trench 112 without risk of depositing sealing material in the cavity 120, notably on the device 100. In FIG. 11, the trench 112 is sealed by depositing by PVD a layer of aluminium 122 over the whole of the cover 106. In a variant, the sealing of the trench 112 may be obtained by a localised deposition of a sealing material above the trench 112.

In the embodiment described previously, the etching of the material of the portion 104 making it possible to release the portion 116 vis-à-vis the sacrificial material is made uniquely through the trench 112. In a variant, it is possible that in addition to the trench 112, holes 124 of dimensions substantially similar to the width of the trench 112 are made through the cover 106, advantageously through the portion 116 as in the example shown in FIG. 12. Thus, the elimination of the part of the portion 104 releasing the portion 116 is obtained more quickly, which makes it possible to end up more quickly in the deformation of the portion 116 in the position enlarging the dimensions of the trench 112. These holes 124 also contribute to the etching of the portion 104 after the portion 116 deforms.

Such holes 124 may also be made over all or part of the cover 106 without necessarily being located at the portion 116.

In the first embodiment described previously, the deformation of the portion 116 is obtained thanks to the residual stresses present in the materials of the cover 106, that is to say thanks to the different mechanical stresses between the materials forming the cover 106. In a second embodiment, this deformation of the portion 116 may be obtained due to the fact that the materials forming the cover 106 comprise different thermomechanical properties and that during the etching of the portion 104, the portion 116 is subjected to a sufficient temperature to generate this deformation.

According to this second embodiment and taking once again the encapsulation structure described previously in relation with FIGS. 1 to 12, a substantially similar deformation of the portion 116 may be obtained by producing the cover 106 such that the layers 108 and 110 are made from materials having different coefficients of thermal expansion. The first layer 108 which is deposited against the sacrificial portion 104 comprises in this case a first material having a coefficient of thermal expansion greater than that of a second material of the second layer 110. The choice of the materials forming such a cover 106 and the geometries of the portion 116 may be made according to the instructions of the document "*Pyromètres à bilames*" of J. Jouanneau, *Techniques de l'Ingénieur*, R 2540-1 to R 2540-10. The table below also gives several metals that can be used to produce the cover 106, as well as the values of the coefficients of thermal expansion α and Young's modulus E of these materials:

| Metal | α ($10^{-6}$/° C.) | E (GPa) |
|---|---|---|
| Al | 23.1 | 70 |
| Cu | 16.5 | 130 |
| Ni | 13.4 | 200 |
| Pt | 8.8 | 168 |
| Ti | 8.6 | 116 |
| Zr | 5.7 | 68 |

For example, the first layer 108 may comprise aluminium and the second layer 110 may comprise titanium. In this case, when the etching of the sacrificial material of the portion 104 is implemented at a sufficiently high temperature, generally above around 100° C. and for example of the order of 200° C., the portion 116 then deforms, thus increasing the section of passage of etching agents of the sacrificial material. Once the etching of the portion 104 is finished, the encapsulation structure is subjected to ambient temperature, enabling the portion 116 to recover its initial position. The sealing of the trench 112 may then be carried out. When the sealing is carried out a temperature greater than that deforming the portion 116, one of the layers of the cover 106 participating in the deformation of the portion 116 may be eliminated before the implementation of this sealing in order to avoid the portion 116 being deformed during sealing. When the sealing is carried out at a temperature below that deforming the portion 116, the layers of the cover 106 may be conserved. When the first layer 108 comprises titanium, or more generally comprises a getter material, given the getter properties of this material, that is to say its aptitude to adsorb and/or absorb gaseous molecules such as molecules of $H_2O$, $H_2$, CO, $CO_2$, $N_2$, $O_2$, it is possible to adjust the final pressure in the cavity 120 by activating the material of the first layer 108 by heating to a temperature greater than or equal to its activation temperature, generally between around 250° C. and 400° C.

The variants described previously for the first embodiment may also apply to the second embodiment.

The two embodiments described previously may be combined with each other. Thus, the cover 106 may be produced from several layers of materials having different residual stresses but also different coefficients of thermal expansion. This may notably be obtained by producing each of the first and second layers 108, 110 as a multilayer, or a stack of several different materials. Thus, a sufficient deformation of the portion 116 may be all the same obtained by combining the deformation due to the effect of the residual stresses of the materials that are present and that due to the effect of thermal expansion of these materials, and does so even if the temperature at which the etching of the sacrificial material of the portion 104 is limited or if the materials forming the cover 106 have moderate residual stresses or coefficients of thermal expansion.

In the two embodiments described previously, the mechanical (residual stresses) or thermomechanical (coefficients of thermal expansion) properties of the materials forming the cover are chosen so that the portion 116 deforms, during the etching of the sacrificial material of the portion 104, such that the free end 119 of the portion 116 moves towards the outside of the encapsulation structure. In a variant, it is possible that the materials of the cover 106 are chosen such that their mechanical and/or thermomechanical properties deform the portion 116, during the etching of the sacrificial material of the portion 104, by moving the free end 119 of the portion 116 towards the inside of the encapsulation structure or the inside of the cavity 120, that is to say in a direction going from this portion 116 to the device 100.

According to a variant of the two embodiments described previously, it is possible that the cover comprises one or more additional layers arranged above and/or below the layers having different mechanical and/or thermomechanical properties. In this case, the trench 112 is made such that it also traverses this or these additional layers. In addition, the thickness(es) of this or these additional layer(s) as well as the nature of the material(s) of this or these additional layer(s) are such that the part(s) of this or these additional layer(s) arranged against the portion 116 can deform while following the deformation of the portion 116 in order that the section of passage of etching agents through the trench 112 indeed increases during the deformation of the portion 116.

The invention claimed is:

1. A method for encapsulating at least one microelectronic device, comprising at least:
   producing at least one portion of sacrificial material covering at least the microelectronic device;
   producing at least one cover covering at least the portion of sacrificial material, the cover comprising at least two superimposed layers of separate materials and having different residual stresses and/or different coefficients of thermal expansion;
   etching, through the cover, of at least one trench of which the pattern, at an upper face of the cover, comprises at least one arc or at least two straight segments non-parallel with respect to each other and joining up at an intersection point, the at least one arc or the at least two straight segments forming a concave shape;
   etching of the portion of sacrificial material through the trench such that, during this etching, a portion of the cover having a convex shape defined by the concave shape of the arc or the straight segments of the trench deforms under mechanical stress generated by the residual stresses and/or a thermal expansion of said at least two layers of the cover and increases the dimensions of the trench;
   at least partial elimination of the mechanical stress;
   depositing at least one sealing material at least on the trench.

2. The method according to claim 1, in which, during the etching of the portion of sacrificial material, the deformation of the portion of the cover is such that a free end of the portion of the cover moves outside a cavity formed by the etching of the portion of sacrificial material.

3. The method according to claim 1, in which the cover further comprises at least one additional layer through which at least the trench is etched and such that a part of this additional layer having a convex shape defined by the concave shape of the arc or the straight segments of the trench forms part of the portion of the cover that deforms during the etching of the portion of sacrificial material.

4. The method according to claim 1, in which the cover has a thickness less than or equal to around 10 μm.

5. The method according to claim 1, in which the steps implemented produce a collective encapsulation of several microelectronic devices arranged on a same substrate.

6. The method according to claim 1, in which, when one of the layers of the cover arranged against the portion of sacrificial material comprises at least one getter material, the method further comprises, after the deposition of the sealing material, a step of thermal activation of said getter material.

7. The method according to claim 1, in which the step of etching of the trench through the cover also etches holes through the cover and having at least one dimension substantially similar to a width of the trench.

8. The method according to claim 7, in which the holes traverse the portion of the cover that deforms during the etching of the portion of sacrificial material.

9. The method according to claim 1, in which a first of the two layers of the cover, arranged between the portion of sacrificial material and a second of the two layers of the cover, comprises a coefficient of thermal expansion greater than that of the second of the two layers of the cover, and in which the etching of the portion of sacrificial material is implemented at a temperature generating a deformation of the portion of the cover due to the thermal expansion of the two layers.

10. The method according to claim 9, in which the first of the two layers of the cover comprises aluminium and the second of the two layers of the cover comprises titanium.

11. The method according to claim 9, in which the deposition of the sealing material is implemented at ambient temperature.

12. The method according to claim 1, in which a first of the two layers of the cover arranged between the portion of sacrificial material and a second of the two layers of the cover comprises a residual stress of different value and/or type to the residual stress of the second of the two layers of the cover.

13. The method according to claim 12, in which the first of the two layers of the cover comprises a residual compressive stress and the second of the two layers of the cover comprises a residual tensile stress.

14. The method according to claim 12, in which the first of the two layers of the cover comprises $SiO_2$ and the second of the two layers of the cover comprises nickel.

15. The method according to claim 12, in which the second of the two layers of the cover comprises a stack of a sub-layer including titanium covering the first of the two layers of the cover and a layer of nickel covering the sub-layer.

16. The method according to claim 12, in which the at least partial elimination of the mechanical stress deforming the portion of the cover comprises the implementation of a removal of a least one part of the second of the two layers of the cover.

\* \* \* \* \*